(12) United States Patent
Kanao et al.

(10) Patent No.: US 10,027,334 B2
(45) Date of Patent: Jul. 17, 2018

(54) COMPUTING APPARATUS AND COMPUTING METHOD

(71) Applicant: KABUSHIKI KAISHA TOSHIBA, Tokyo (JP)

(72) Inventors: Taro Kanao, Kanagawa (JP); Tazumi Nagasawa, Kanagawa (JP); Hayato Goto, Kanagawa (JP); Kiwamu Kudo, Kanagawa (JP); Hirofumi Suto, Kanagawa (JP); Michinaga Yamagishi, Kanagawa (JP); Koichi Mizushima, Kanagawa (JP); Rie Sato, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 154 days.

(21) Appl. No.: 15/261,058

(22) Filed: Sep. 9, 2016

(65) Prior Publication Data
US 2017/0272087 A1    Sep. 21, 2017

(30) Foreign Application Priority Data

Mar. 15, 2016 (JP) ................................. 2016-051474

(51) Int. Cl.
*H03L 7/26* (2006.01)
*H03L 7/099* (2006.01)

(52) U.S. Cl.
CPC .............. *H03L 7/26* (2013.01); *H03L 7/099* (2013.01)

(58) Field of Classification Search
CPC ....................................................... H03L 7/26
USPC ....................................................... 331/94.1
See application file for complete search history.

(56) References Cited

U.S. PATENT DOCUMENTS

| 2012/0124120 A1 | 5/2012 | Morise et al. |
| 2013/0009712 A1* | 1/2013 | Braganca ............. G01R 33/093 |
|  |  | 331/94.1 |
| 2013/0069730 A1* | 3/2013 | Yang .................... H03B 15/006 |
|  |  | 331/94.1 |
| 2014/0025716 A1 | 1/2014 | Hoppensteadt et al. |
| 2014/0046626 A1 | 2/2014 | Yamamoto et al. |

(Continued)

FOREIGN PATENT DOCUMENTS

| JP | 2010-206023 | 9/2010 |
| JP | 5354233 | 11/2013 |

(Continued)

OTHER PUBLICATIONS

Utsunomiya, S. et al. (Sep. 12, 2011), "Mapping of Ising models onto injection-locked laser systems," *Optics Express*, vol. 19, No. 19; pp. 18091-18108.

(Continued)

*Primary Examiner* — Joseph Chang
(74) *Attorney, Agent, or Firm* — Finnegan, Henderson, Farabow, Garrett & Dunner, L.L.P.

(57) ABSTRACT

According to an embodiment, a computing apparatus includes spin torque oscillators, an interaction unit, a variable direct-current supply device, and a measuring unit. The interaction unit controls an interaction between the spin torque oscillators. The variable direct-current supply device supplies a current to induce oscillations of the spin torque oscillators. The measuring unit measures AC signals obtained from the spin torque oscillators.

14 Claims, 5 Drawing Sheets

(56) References Cited

U.S. PATENT DOCUMENTS

2016/0118106 A1    4/2016    Yoshimura et al.

FOREIGN PATENT DOCUMENTS

WO    WO-2011/033640    3/2011
WO    WO-2014/192153    12/2014

OTHER PUBLICATIONS

Wang, Z. et al. (2013), "Coherent Ising maching based on degenerate optical parametric oscillators," *Physical Review*, vol. 88; pp. 063853-1-063853-9.
Slavin, A. et al. (Apr. 2009), "Nonlinear Auto-Oscillator Theory of Microwave Generation by Spin-Polarized Current," *IEEE Transactions on Magnetics*, vol. 45, No. 4, pp. 1875-1918.
Zeng, Z. et al. (2013), "Spin transfer nano-oscillators," *Nanoscale*, vol. 5, pp. 2219-2231.
Mahboob, I. et al. (Jun. 24, 2016), "An electromechanical Ising Hamiltonian," *Science Advances*, vol. 2, 8 pages.
Goto, H. (2016), "Bifurcation-based adiabatic quantum computation with a nonlinear oscillator network," *Scientific Reports*, vol. 6; pp. 1-8.

\* cited by examiner

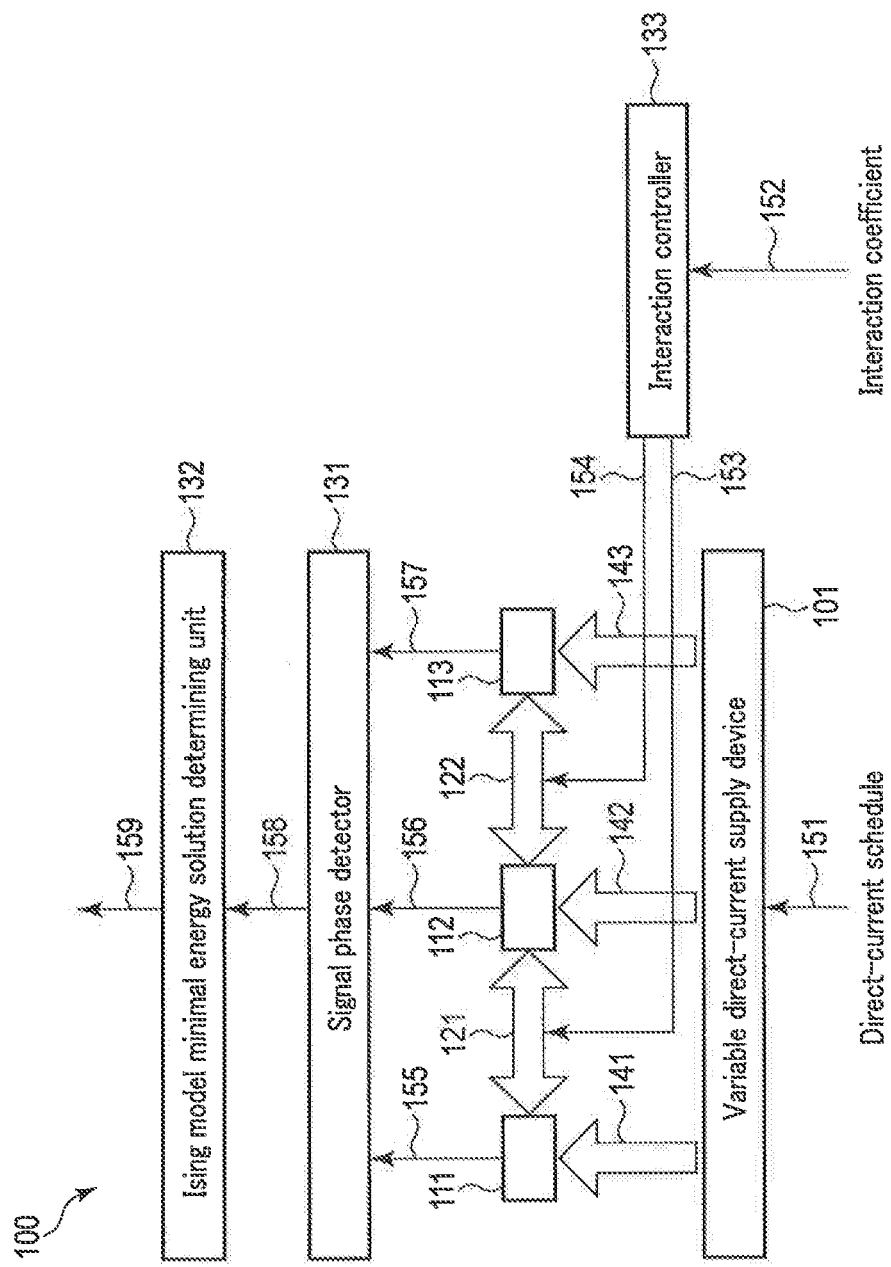
F I G. 1

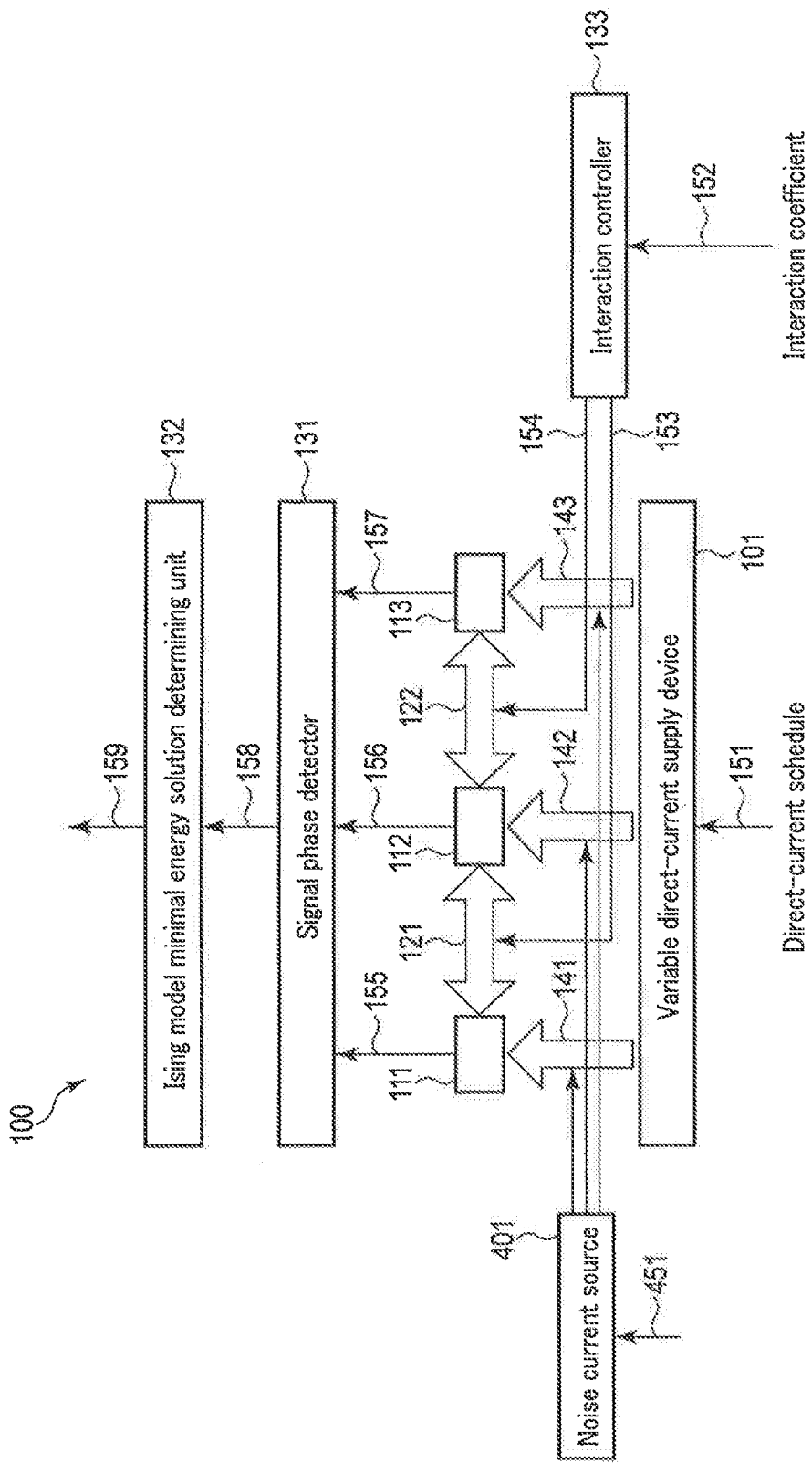
F I G. 4

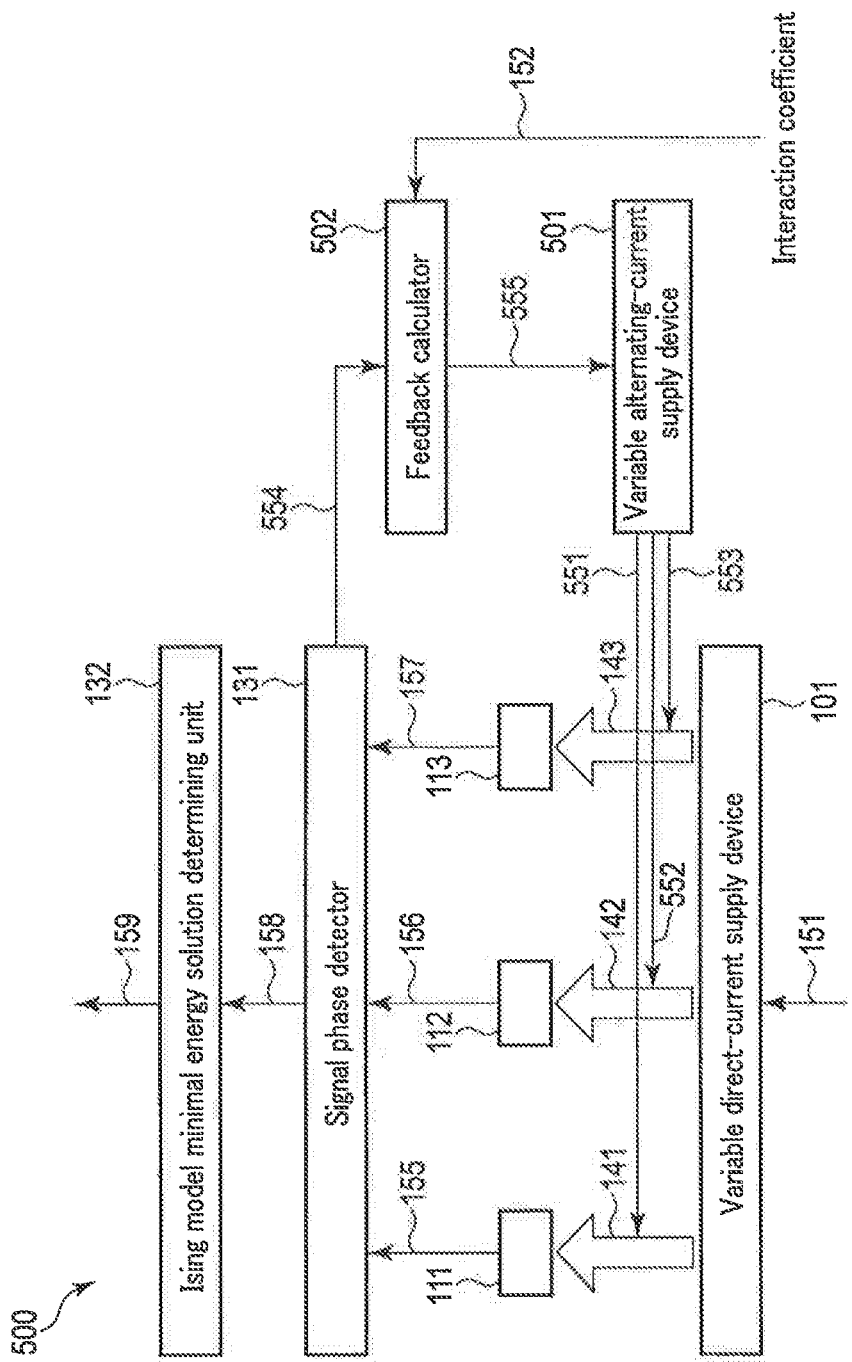
F I G. 5

COMPUTING APPARATUS AND COMPUTING METHOD

CROSS-REFERENCE TO RELATED APPLICATIONS

This application is based upon and claims the benefit of priority from Japanese Patent Application No. 2016-051474, filed Mar. 15, 2016, the entire contents of which are incorporated herein by reference.

FIELD

Embodiments described herein relate generally to a computing apparatus and a computing method which employ a spin torque oscillator.

BACKGROUND

When a combinational optimization problem is solved by sequential computation of a von Neumann computer which is mainly used at present, the computing time is known to exponentially increase relative to the number of variables. Hence, there is a demand for a high-speed computing apparatus that directly utilizes a physical phenomenon. The combinational optimization problem is known to be sometimes mapped to the energy minimization problem of a statistical model called an Ising model. In the Ising model to which the combinational optimization problem is mapped, the interactions between elements are not even. If there is a computing apparatus for solving the energy minimization problem of the Ising model at a high speed, a corresponding combinational optimization problem can be solved at a high speed.

BRIEF DESCRIPTION OF THE DRAWINGS

FIG. 1 is a block diagram showing a computing apparatus according to the first embodiment;
FIG. 4 is a block diagram showing a modification of the computing apparatus according to the first embodiment;
FIG. 5 is a block diagram showing a computing apparatus according to the second embodiment.

DETAILED DESCRIPTION

Figure 2:
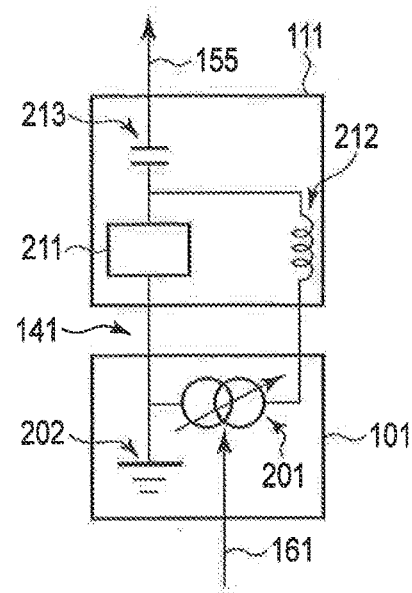
FIG. 2 is a block diagram showing an example of the structure including a spin torque oscillator unit and a variable direct-current supply device shown in FIG. 1.

According to an embodiment, a computing apparatus includes spin torque oscillators, an interaction unit, a variable direct-current supply device, and a measuring unit. The interaction unit controls an interaction between the spin torque oscillators. The variable direct-current supply device supplies a current to induce oscillations of the spin torque oscillators. The measuring unit measures AC signals obtained from the spin torque oscillators.

Hereinafter, embodiments will be described with reference to the drawings. In the following embodiments, like reference numerals will be used to denote like elements, and redundant descriptions will be omitted where appropriate.

The computation scheme of a computing apparatus using a spin torque oscillator according to an embodiment will be described first.

In a spin torque oscillator, a magnetization oscillation having a frequency of several hundred MHz to several ten GHz is induced by a direct current equal to or more than a threshold current and converted into an AC electrical signal by a magnetoresistance effect. The spin torque oscillator typically includes two magnetic layers and a nonmagnetic layers between them. When a direct current is supplied in a direction perpendicular to the layers, a spin-polarized current (spin current) flows from the first magnetic layer to the second magnetic layer. The spin-polarized current causes a spin torque to act on the magnetization of the second magnetic layer. Consequently, the spin torque oscillator oscillates. More generally, an element that induces a magnetization oscillation by a direct current and outputs an AC electrical signal will be referred to as a spin torque oscillator here. For example, when a material with a spin orbit interaction is used, a spin current can be generated without using a magnetic material, as is known. When a spin torque is made to act on a magnetic material by the spin current, a magnetization oscillation can be induced.

The oscillation of the spin torque oscillator is known to be described by a free-running oscillator model given by $$\frac{dc}{dt} = -i\omega c - [\Gamma_+(|c|^2) - \Gamma_-(|c|^2)]c, \quad (1)$$

where c can be interpreted as an AC signal, obtained from the spin torque oscillator, transformed into a complex number. The actual AC signal can be obtained by, for example, extracting the real part of c. Additionally, t is time, i is the imaginary unit, $\psi$ is the oscillation frequency, $\Gamma_+$ is the positive relaxation rate, and $\Gamma_-$ is the negative relaxation rate. $\Gamma_-$ represents energy injection by a current. This model can reproduce, by a small number of parameters, the characteristic of the AC signal obtained from the spin torque oscillator. This model is approximately derived from a Landau-Lifshitz-Gilbert equation including a spin torque term, which is a more basic equation of a magnetization motion.

Letting the oscillation power in a steady oscillation be $|c|^2=p_0$, the positive and negative relaxation rates can be approximated to $$\Gamma_+(|c|^2) - \Gamma_-(|c|^2) \simeq \Gamma_p\left(\frac{|c|^2}{p_0} - 1\right).$$

In general, $\omega$ depends on c. However, the dependence can be reduced by the structure of the spin torque oscillator or the like, as is known. When the dependence of $\omega$ on c is small, equation (1) can be rewritten as $$\frac{d\sigma}{dt} = -\Gamma_p\left(\frac{|\sigma|^2}{p_0} - 1\right)\sigma,$$

where $\sigma = ce^{i\psi t}$.

The time evolution of spin torque oscillators that have the same oscillation characteristic and interact with each other is described by a model given by $$\frac{d\sigma_i}{dt} = -\Gamma_p\left(\frac{|\sigma_i|^2}{p_0} - 1\right)\sigma_i + \sum_j g_{ij}\sigma_j, \quad (2)$$

where i and j are indices to designate spin torque oscillators, and $g_{ij}$ is a coefficient representing the interaction between the ith spin torque oscillator and the jth spin torque oscillator.

Under a condition $g_{ij}=g_{ji}^*$ (where * represents a complex conjugate), an amount given by $$E = -\sum_{ij} g_{ij}\sigma_i^*\sigma_j + \sum_i \frac{\Gamma_p}{2}\left(\frac{|\sigma_i|^2}{p_0} - 1\right)^2 \quad (3)$$

is known to take the local minimum value in the steady solution of equation (2).

The condition $g_{ij}=g_{ji}^*$ can be met by controlling the interaction. When a current used to induce the oscillation of the spin torque oscillator is made sufficiently large, $\Gamma_p$ can be made sufficiently large as compared to $g_{ij}$. At this time, when the amount given by equation (3) is minimized, the minimum value of an amount given by $$-\sum_{ij} g_{ij}\sigma_i^*\sigma_j \quad (4)$$

can be obtained under a condition of constraint $|\sigma_i|^2=p_0$.

This is the energy of a model called a (classic) XY model in the statistical mechanics, and the phase of a variable $\sigma_i$ can take a continuous value from 0 to $2\pi$. To obtain not the local minimum value but the minimum value, a state apart from near the local minimum value is attained by noise. When the noise is gradually reduced with respect to the oscillation power, a minimum value or a value approximate to it can be obtained.

The time needed to relax to the steady state is roughly given by $1/\Gamma_p$. Concerning the spin torque oscillator, a value of the order of 0.1 ns$^{-1}$ to 1 ns$^{-1}$ has been reported as $\Gamma_p$. In this case, relaxation to the steady state can occur in a time of the order of 0.1 ns to 10 ns, and therefore, the computation can be completed at a high speed.

In an Ising model that is important in a combinational optimization problem, the phase is limited to two values 0 and $\pi$, and energy is expressed as $$-\sum_{ij} J_{ij}s_is_j,$$

$$s_i = \pm 1$$

When the interaction coefficient $g_{ij}$ is set in proportion to an interaction coefficient $J_{ij}$ of a problem to be solved, the solution of a corresponding Ising model can be estimated from a solution that minimizes the energy of the XY model.

A computing apparatus using a spin torque oscillator according to an embodiment will be described next.

FIG. 1 schematically shows a computing apparatus 100 according to the first embodiment. As shown in FIG. 1, the computing apparatus 100 includes a variable direct-current supply device 101, spin torque oscillator units 111, 112, and 113, interaction generators 121 and 122, a signal phase detector 131 corresponding to a measuring unit, an Ising model minimal energy solution determining unit 132, an interaction controller 133, current paths 141, 142, and 143, and signal lines 151 to 159. In this embodiment, the number of spin torque oscillator units is three. However, the number is not limited to this, and two or four or more spin torque oscillator units may be provided.

The variable direct-current supply device 101 is connected to the spin torque oscillator units 111, 112, and 113 via the current paths 141, 142, and 143. The variable direct-current supply device 101 supplies a direct current to the current paths 141, 142, and 143 in accordance with a direct-current schedule input from the signal line 151. Each of the spin torque oscillator units 111, 112, and 113 includes a spin torque oscillator, and outputs an AC signal upon receiving the direct current from the variable direct-current supply device 101. The AC signals output from the spin torque oscillator units 111, 112, and 113 are given to the signal phase detector 131 via the signal lines 155, 156, and 157.

FIG. 2 shows an example of the structure including the spin torque oscillator unit 111 and the variable direct-current supply device 101. The variable direct-current supply device 101 includes a variable direct-current source 201 and a ground 202. The spin torque oscillator unit 111 includes a spin torque oscillator 211, a coil 212, and a capacitor 213. The first terminal of the capacitor 213 is connected to the signal line 155. The second terminal of the capacitor 213 is connected to the first terminals of the spin torque oscillator 211 and the coil 212 which are provided in parallel. The second terminal of the spin torque oscillator 211 is connected to the ground 202. The second terminal of the coil 212 is connected to the variable direct-current source 201. The variable direct-current source 201 operates in accordance with the direct-current schedule, and supplies a direct current to the spin torque oscillator unit 111. The coil 212 allows the direct current to directly be supplied to the spin torque oscillator 211. The capacitor 213 allows the AC component of an electrical signal to be extracted from the signal line 155.

Each of the spin torque oscillator units 112 and 113 can have the same structure as the spin torque oscillator unit 111 shown in FIG. 2, and can be connected to the variable direct-current supply device 101 in the same way as the spin torque oscillator unit 111 shown in FIG. 2.

Referring back to FIG. 1, the interaction controller 133 controls the interaction generators 121 and 122 based on an interaction coefficient input from the signal line 152. Specifically, the interaction controller 133 sets the interaction coefficient $g_{ij}$ based on the input interaction coefficient $J_{ij}$, and outputs control signals (for example, currents) to control the interaction generators 121 and 122 so as to implement the interaction coefficient $g_{ij}$. The control signals are given to the interaction generators 121 and 122 via the signal lines 153 and 154. In this embodiment, the interaction generators 121 and 122 and the interaction controller 133 form an interaction unit that controls the interactions between the spin torque oscillator units 111, 112, and 113.

Figure 3:
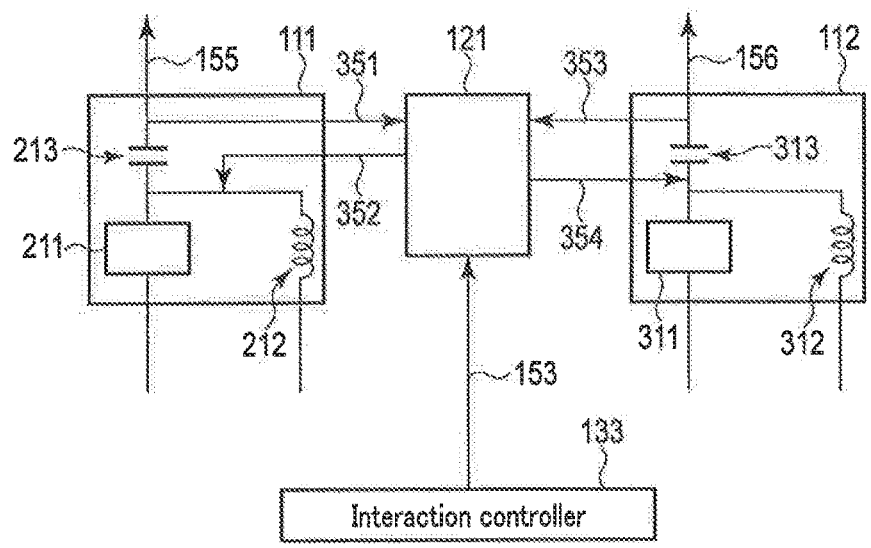
FIG. 3 is a block diagram showing an example of the structure including the spin torque oscillator unit and an interaction generator shown in FIG. 1.

FIG. 3 shows an example of the structure including the spin torque oscillator units 111 and 112 and the interaction generator 121. The spin torque oscillator unit 111 has the same structure as that shown in FIG. 2. The spin torque oscillator unit 112 includes a spin torque oscillator 311, a coil 312, and a capacitor 313. The first terminal of the capacitor 313 is connected to the signal line 156. The second terminal of the capacitor 313 is connected to the spin torque oscillator 311 and the coil 312 which are provided in parallel. The first terminal of the interaction generator 121 is connected to the signal line 155 via a signal line 351. The second terminal of the interaction generator 121 is connected, via a signal line 352, to a signal line that connects the capacitor 213, the spin torque oscillator 211, and the coil 212. The third terminal of the interaction generator 121 is connected to the signal line 156 via a signal line 353. The fourth terminal of the interaction generator 121 is connected, via a signal line 354, to a signal line that connects the capacitor 313, the spin torque oscillator 311, and the coil 312. The fifth terminal of the interaction generator 121 is connected to the interaction controller 133 via the signal line 153.

The interaction generator 121 receives, from the signal line 353, an AC signal output from the spin torque oscillator unit 112, modulates the amplitude and phase of the AC signal, and injects the modulated AC signal to the spin torque oscillator 211 via the signal line 352. The direct current from the variable direct-current supply device 101 and the alternating current from the interaction generator 121 are thus supplied to the spin torque oscillator 211. Simultaneously, the interaction generator 121 receives, from the signal line 351, an AC signal output from the spin torque oscillator unit 111, modulates the amplitude and phase of the AC signal, and injects the modulated AC signal to the spin torque oscillator 311 via the signal line 354. The direct current from the variable direct-current supply device 101 and the alternating current from the interaction generator 121 are thus supplied to the spin torque oscillator 311.

Note that the connection positions of the signal lines 351 to 354 are not limited to the positions shown in FIG. 3, and may be other positions if the AC signal from the spin torque oscillator unit 111 can be injected into the spin torque oscillator unit 112 and the AC signal from the spin torque oscillator unit 112 can be injected into the spin torque oscillator unit 111.

The amplitude and phase of an AC signal are controlled based on the value $g_{ij}$ set by the interaction controller 133. The condition $g_{ij}=g_{ji}*$ can be met by controlling the phase of the AC signal. The interaction generator 121 is implemented in an electric circuit including a plurality of elements such as an amplifier, an inverter, a capacitor, a resistor, a coil, a delay device, or a power supply. Control of the amplitude and phase to set values, which is performed by the interaction generator 121, is done by making the characteristic of the electric circuit variable. An example of a variable resistor that can be integrated and used as a circuit element is a magnetoresistive element. When the direction of the magnetization of the magnetoresistive element is reversed by, for example, a current from the interaction controller 133, the resistance value of the element can be changed.

When the interaction is implemented by mutual current injection as described above, a spin torque oscillator that exhibits a larger magnetoresistive ratio is preferably used. As such a spin torque oscillator, there is, for example, a spin torque oscillator using a magnetic tunnel junction. From the viewpoint of power consumption, the threshold current of oscillation is preferably small. A magnetic field can be applied from outside in a direction appropriate to cause the spin torque oscillator to oscillate.

The interaction between the spin torque oscillators can also be implemented by a spin wave. Propagation of the spin wave can be controlled by applying a magnetic field, a voltage, or a spin torque by a spin current to a magnetic material serving as a medium for propagating the spin wave. By using these, the interaction between the spin torque oscillators can be controlled. As a variable field source, for example, a magnetoresistive element can be used. When the magnetization of the magnetoresistive element is arranged near the magnetic material serving as the propagation medium of the spin wave, and the direction of the magnetization of the magnetoresistive element is reversed by the current from the interaction controller 133, the magnetic field applied to the magnetic material serving as the propagation medium of the spin wave can be changed.

The interaction generator 122 shown in FIG. 1 can generate an interaction between the spin torque oscillator unit 112 and the spin torque oscillator unit 113 in the same way as the interaction generator 121 shown in FIG. 3. The computing apparatus 100 may further include an interaction generator that generates an interaction between the spin torque oscillator unit 111 and the spin torque oscillator unit 113.

In the steady state, oscillations of the spin torque oscillator units 111, 112, and 113 (more specifically, oscillations of the spin torque oscillators in the spin torque oscillator units 111, 112, and 113) can be synchronized by the functions of the interaction generators 121 and 122. That is, the spin torque oscillator units 111, 112, and 113 can oscillate at the same oscillation frequency, and therefore, phase differences between the spin torque oscillator units 111, 112, and 113 can be kept fixed. For this purpose, a spin torque oscillator having such a characteristic that readily synchronizes the oscillation with the injected alternating current is preferably used. As a spin torque oscillator having such a characteristic, there is, for example, a spin torque oscillator in which the axes of easy magnetization of two magnetic layers included in it are not collinear (parallel or antiparallel).

The signal phase detector 131 detects the phases of the AC signals obtained from the spin torque oscillator units 111, 112, and 113 and sends the information indicative of the detected phases to the Ising model minimal energy solution determining unit 132 via the signal line 158. As an example, phase detection is done by comparing the phases of the AC signals of the spin torque oscillator units 111, 112, and 113. For example, the phase difference of the AC signal of the spin torque oscillator unit 112 with respect to the AC signal of the spin torque oscillator unit 111 can be obtained by heterodyne detection, i.e., by multiplying the AC signal of the spin torque oscillator unit 112 by the AC signal of the spin torque oscillator unit 111 and extracting the DC component of the resulting signal using a filter. The phase difference of the AC signal of the spin torque oscillator unit 113 with respect to the AC signal of the spin torque oscillator unit 111 can be obtained in the same way as described above. As another example, using a reference signal having the same frequency as that of the AC signals of the spin torque oscillator units 111, 112, and 113, the signal phase detector 131 can obtain the phase difference between the reference signal and each of the AC signals of the spin torque oscillator units 111, 112, and 113 by heterodyne detection.

The Ising model minimal energy solution determining unit 132 determines a solution or approximate solution to minimize the energy of the Ising model based on the phases of the signals of the spin torque oscillator units 111, 112, and 113 detected by the signal phase detector 131, and outputs the determination result via the signal line 159. For example, let the phases of the spin torque oscillator units 111, 112, and 113 be $\varphi_1$, $\varphi_2$, and $\varphi_3$, respectively. The Ising model minimal energy solution determining unit 132 determines the relative directions of Ising spins based on the signs (positive or negative) of $\cos(\varphi_2-\varphi_1)$ and $\cos(\varphi_3-\varphi_1)$. As described above, using the phase of the signal of a certain spin torque oscillator as a reference, the relative direction (the same direction or opposite direction) of the phase of the signal of another spin torque oscillator is determined. This makes it possible to output one solution of the Ising model without inconsistency.

A computing method according to the first embodiment will be described next.

First, the interaction between the spin torque oscillators according to a model to be solved is implemented. Specifically, the interaction controller 133 receives the interaction coefficient $J_{ij}$ of the model to be solved, sets the interaction coefficient $g_{ij}$ based on it, and causes the interaction generators 121 and 122 to operate so as to implement the interaction coefficient $g_{ij}$.

Next, the variable direct-current supply device 101 supplies a direct current to the spin torque oscillator units 111, 112, and 113 in accordance with the direct-current schedule. The direct-current schedule is set such that the current value gradually increases from a current value smaller than the oscillation threshold of the spin torque oscillator units 111, 112, and 113 so as to exceed the oscillation threshold and finally reach a stable steady oscillation. In the stable steady oscillation, $\Gamma_p$ described above becomes sufficiently large, and the condition of constraint $|\sigma_i|^2 = p_0$ is met. When the current value is continuously increased from a value less than the oscillation threshold so as to exceed the oscillation threshold, an oscillation that minimizes equation (3) can be induced first if the influence of noise can be neglected. In fact, there is noise, and a state near the minimum value may be induced. It is possible to prevent the oscillation from being trapped by the state of the local minimum value due to the influence of noise. For example, when the current value is gradually increased from this state, the ratio of the oscillation power to noise can be made large, and the influence of noise can be reduced. This can increase the probability of reaching the minimum value to be finally obtained.

After the oscillations of the spin torque oscillator units 111, 112, and 113 reach the steady state, the signal phase detector 131 detects the phases of the AC signals of the spin torque oscillator units 111, 112, and 113. The Ising model minimal energy solution determining unit 132 obtains, based on the detected phases, the optimum solution or approximate solution of the model to be solved.

Note that the approach to the minimum value can also be implemented by making the noise value small. For example, a random current serving as noise is added from outside to the direct current flowing to the current paths 141, 142, and 143, and the magnitude of the random current is decreased with time, thereby making an approach to the state near the minimum value. In this case, as shown in FIG. 4, the computing apparatus 100 further includes a noise current source 401 connected to the current paths 141, 142, and 143, and a signal line 451 that inputs scheduling of the magnitude of the noise current generated by the noise current source 401. The noise current can be generated by, for example, amplifying, by an amplifier, a thermal noise signal normally generated by a resistor. The magnitude of the noise current is adjusted by changing the gain of the amplifier.

FIG. 5 schematically shows a computing apparatus 500 according to the second embodiment. As shown in FIG. 5, the computing apparatus 500 includes a variable direct-current supply device 101, spin torque oscillator units 111, 112, and 113, a signal phase detector 131, an Ising model minimal energy solution determining unit 132, current paths 141, 142, and 143, signal lines 151, 152, 155 to 159, and 551 to 555, a variable alternating-current supply device 501, and a feedback calculator 502. The variable direct-current supply device 101, the spin torque oscillator units 111, 112, and 113, and the Ising model minimal energy solution determining unit 132 have the same structures and functions as in the first embodiment, and a description thereof will be omitted. In this embodiment, the variable alternating-current supply device 501 and the feedback calculator 502 form an interaction unit.

The variable alternating-current supply device 501 is connected to the current paths 141, 142, and 143 via the signal lines 551, 552, and 553. The spin torque oscillator units 111, 112, and 113 oscillate by currents from the variable direct-current supply device 101 and the variable alternating-current supply device 501. The signal phase detector 131 measures the phases of AC signals obtained from the spin torque oscillator units 111, 112, and 113 in a steady oscillation state, and sends the measurement results to the feedback calculator 502 via the signal line 554. The feedback calculator 502 may convert the measurement results received from the signal phase detector 131 from analog data to digital data. An interaction coefficient $J_{ij}$ is input from the signal line 152 to the feedback calculator 502. For each of the spin torque oscillator units 111, 112, and 113, the feedback calculator 502 calculates an amount corresponding to the last term (interaction term) on the right-hand side of equation (2) from the measurement result and the interaction coefficient $J_{ij}$. This calculation may be done by a digital computer. The feedback calculator 502 gives the calculation result to the variable alternating-current supply device 501 via a signal line 555. The variable alternating-current supply device 501 supplies alternating currents corresponding to the calculation results received from the feedback calculator 502 to the spin torque oscillator unit 111 via the signal line 551 and the current path 141, to the spin torque oscillator unit 112 via the signal line 552 and the current path 142, and to the spin torque oscillator unit 113 via the signal line 553 and the current path 143. By keeping this state, the spin torque oscillator units 111, 112, and 113 reach the steady oscillation state.

After reaching the steady oscillation state, the same operation as described above is performed. When this operation is repeated, the value of the interaction term by the feedback calculator 502 and the value of the interaction term obtained from the output of the signal phase detector 131 converge to the same value (self-consistency).

A computing method according to the second embodiment will be described next.

First, the interaction coefficient $J_{ij}$ of a model to be solved is input to the feedback calculator 502, and a direct-current schedule is input to the variable direct-current supply device 101. The variable direct-current supply device 101 supplies a direct current to the spin torque oscillator units 111, 112, and 113 in accordance with the direct-current schedule. Specifically, first, the variable direct-current supply device 101 supplies a current of a value slightly larger than the oscillation threshold of the spin torque oscillator units 111, 112, and 113. After reaching the steady oscillation state, the signal phase detector 131 measures AC signals obtained from the spin torque oscillator units 111, 112, and 113, and sends the measurement results to the feedback calculator 502. The feedback calculator 502 calculates an interaction term from each measurement result. The variable alternating-current supply device 501 supplies alternating currents corresponding to the calculation results to the spin torque oscillator units 111, 112, and 113. The spin torque oscillator units 111, 112, and 113 reach the steady oscillation state by time evolution. This operation using the signal phase detector 131, the feedback calculator 502, and the variable alternating-current supply device 501 is repeated until the inputs to the spin torque oscillator units 111, 112, and 113 and the outputs from them become equal.

When the above operation is repeated, the direct current by the variable direct-current supply device 101 is increased. When a stable steady oscillation state is obtained by making the current value sufficiently large, the signal phase detector 131 detects the phases of the AC signals of the spin torque oscillator units 111, 112, and 113. The Ising model minimal energy solution determining unit 132 obtains the optimum solution or approximate solution from the information of the obtained phases.

In this embodiment, an interaction can be implemented for an arbitrary pair of spin torque oscillators using measurement and feedback, as described above.

The state near the optimum solution can also be implemented by gradually decreasing the magnitude of noise in a state in which the oscillation power is kept fixed.

Note that in the first and second embodiments, an example in which the model to be solved is an Ising model has been described. However, the model to be solved may be, for example, an XY model.

According to at least one of the above-described embodiments, computation is performed using a spin torque oscillator that quickly relaxes to a steady state, thereby solving an energy minimization problem such as an Ising model at a high speed.

Figure 6A:
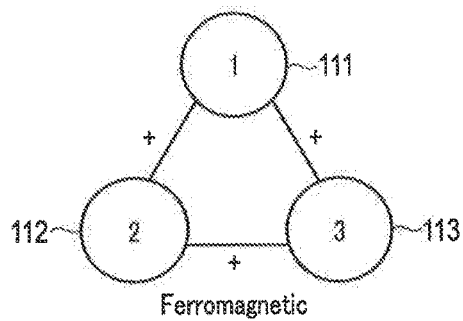
FIGS. 6A and 6B are views showing examples of interactions between three spin torque oscillators.
Figure 6B:
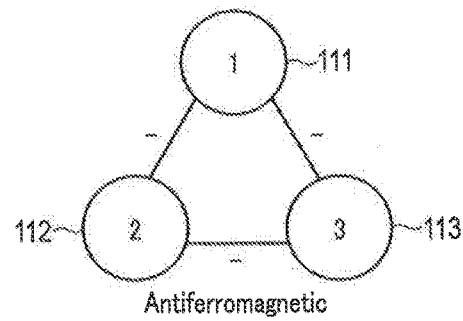

A result of simulation conducted by the present inventors will be explained next with reference to FIGS. 6A, 6B, and 7. The present inventors calculated the time evolution of three interacting spin torque oscillators by a free-running oscillator model with noise. For the sake of simplicity, a direct current used to induce the oscillations of the spin torque oscillators is constant with respect to time. FIGS. 6A and 6B show the settings of the simulation. More specifically, FIG. 6A shows a state in which the three spin torque oscillator units 111, 112, and 113 interact "ferromagnetically", and FIG. 6B shows a state in which the three spin torque oscillator units 111, 112, and 113 interact "antiferromagnetically". The ferromagnetic interaction takes a positive value. Here, $g_{12}=g_{13}=g_{21}=g_{23}=g_{31}=g_{32}=0.1$ ns$^{-1}$ and $g_{11}=g_{22}=g_{33}=0$ are set. The antiferromagnetic interaction takes a negative value. Here, $g_{12}=g_{13}=g_{21}=g_{23}=g_{31}=g_{32}=-0.1$ ns$^{-1}$ and $g_{11}=g_{22}=g_{33}=0$ are set. The power relaxation rate is $\Gamma_p=0.5$ n$^{-1}$. The intensity of noise normalized by the steady oscillation power is 0.001 n$^{-1}$.

Figure 7:
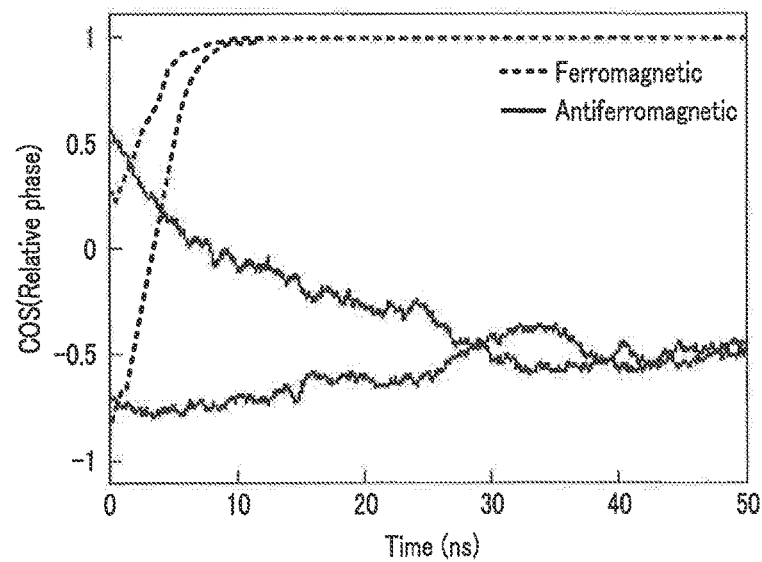
FIG. 7 is a graph showing the time evolution of the relative phases of three interacting spin torque oscillators.

FIG. 7 shows the time evolution of the relative phases of the spin torque oscillators. Let the phases of the oscillations of the three spin torque oscillators be $\varphi_1$, $\varphi_2$, and $\varphi_3$. FIG. 7 shows the time evolutions of $\cos(\varphi_2-\varphi_1)$ and $\cos(\varphi_3-\varphi_1)$. In the ferromagnetic interaction, convergence to $\cos(\varphi_2-\varphi_1)=\cos(\varphi_3-\varphi_1)=1$ occurs in 10 ns, indicating that the spin torque oscillators are in phase. This means a state in which three Ising spins have the same direction, and reproduces the minimal energy state of a ferromagnetic Ising model. In the antiferromagnetic interaction, convergence to $\cos(\varphi_2-\varphi_1)=\cos(\varphi_3-\varphi_1)=-1/2$ occurs in several ten ns. When the directions of the Ising spins are made to correspond to the positive and negative signs of $\cos(\varphi_2-\varphi_1)$ and $\cos(\varphi_3-\varphi_1)$, Ising spins 2 and 3 face the direction opposite to the direction of Ising spin 1. This reproduces one of the minimal energy states of an antiferromagnetic Ising model having three spins.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A computing apparatus comprising:
   spin torque oscillators;
   an interaction unit which controls an interaction between the spin torque oscillators;
   a variable direct-current supply device which supplies a current to induce oscillations of the spin torque oscillators; and
   a measuring unit which measures AC signals obtained from the spin torque oscillators.

2. The apparatus according to claim 1, wherein the spin torque oscillators include a first spin torque oscillator and a second spin torque oscillator, and
   the interaction unit includes an electric circuit which modulates an amplitude and a phase of a first AC signal obtained from the first spin torque oscillator and injects the modulated first AC signal to the second spin torque oscillator, and an electric circuit which modulates an amplitude and a phase of a second AC signal obtained from the second spin torque oscillator and injects the modulated second AC signal to the first spin torque oscillator.

3. The apparatus according to claim 1, wherein the interaction unit includes a propagation medium made of a magnetic material, and controls the interaction using a spin wave propagating through the propagation medium.

4. The apparatus according to claim 1, wherein the interaction unit includes:
   a calculator which performs calculation for a measurement result obtained by the measuring unit; and
   an alternating-current supply device which supplies an alternating current according to a calculation result obtained by the calculator to the spin torque oscillators.

5. The apparatus according to claim 1, wherein the measuring unit measures phases of the AC signals.

6. The apparatus according to claim 1, wherein the measuring unit measures phases of the AC signals using a reference signal.

7. The apparatus according to claim 1, wherein the measuring unit measures phases of the AC signals by mutually referring to the AC signals.

8. The apparatus according to claim 1, further comprising a noise current source which supplies a noise current to the spin torque oscillators.

9. The apparatus according to claim 1, wherein the interaction is set to an interaction of an XY model or an Ising model.

10. The apparatus according to claim 9, further comprising a determining unit which determines a minimal energy solution of the XY model or the Ising model from a measurement result obtained by the measuring unit.

11. A computing method in a computing apparatus including spin torque oscillators, an interaction unit, a variable direct-current supply device, and a measuring unit, the method comprising:
    generating, by the interaction unit, an interaction between the spin torque oscillators;
    supplying, by the variable direct-current supply device, a direct current to the spin torque oscillators such that a current value changes from a value smaller than an oscillation threshold of the spin torque oscillators so as to exceed the oscillation threshold; and
    measuring, by the measuring unit, AC signals obtained from the spin torque oscillators.

12. The method according to claim 11, wherein the generating the interaction includes performing calculation for a measurement result obtained by the measuring unit and supplying an alternating current according to a calculation result to the spin torque oscillators.

13. The method according to claim 12, wherein the measuring the alternating current and the generating the interaction are repeated until the measurement result converges.

14. The method according to claim 13, wherein every time the measuring the alternating current and the supplying the alternating current are repeated, the direct current is increased.

* * * * *